US007968506B2

(12) United States Patent
Chou et al.

(10) Patent No.: US 7,968,506 B2
(45) Date of Patent: Jun. 28, 2011

(54) WET CLEANING STRIPPING OF ETCH RESIDUE AFTER TRENCH AND VIA OPENING FORMATION IN DUAL DAMASCENE PROCESS

(75) Inventors: Chun-Li Chou, Jhubei (TW);
Syun-Ming Jang, Hsin-Chu (TW);
Jyu-Horng Shieh, Hsin-Chu (TW);
Chih-Yuan Ting, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 24 days.

(21) Appl. No.: 12/203,448

(22) Filed: Sep. 3, 2008

(65) Prior Publication Data
US 2010/0055897 A1 Mar. 4, 2010

(51) Int. Cl.
*C11D 7/32* (2006.01)

(52) U.S. Cl. . 510/175; 510/372; 510/461; 257/E21.224; 257/E21.228

(58) Field of Classification Search .................. 510/175, 510/372, 461; 257/E21.224, E21.228
See application file for complete search history.

(56) References Cited

U.S. PATENT DOCUMENTS

| 6,323,169 | B1 * | 11/2001 | Abe et al. ...................... 510/176 |
| 6,720,256 | B1 | 4/2004 | Wu et al. |
| 6,864,193 | B2 | 3/2005 | Chou et al. |
| 7,022,610 | B2 | 4/2006 | Chou et al. |
| 7,115,517 | B2 | 10/2006 | Ye et al. |
| 7,192,489 | B2 | 3/2007 | Lo et al. |
| 7,241,681 | B2 | 7/2007 | Kumar et al. |
| 7,291,553 | B2 | 11/2007 | Chen et al. |
| 7,373,941 | B2 | 5/2008 | Chou et al. |
| 2005/0244988 | A1 | 11/2005 | Wang et al. |
| 2007/0254476 | A1 | 11/2007 | Chou et al. |

FOREIGN PATENT DOCUMENTS

KR    20030049121    6/2003

* cited by examiner

*Primary Examiner* — Zandra Smith
*Assistant Examiner* — Christy L Novacek
(74) *Attorney, Agent, or Firm* — Duane Morris LLP

(57) ABSTRACT

After trench line pattern openings and via pattern openings are formed in a inter-metal dielectric insulation layer of a semiconductor wafer using trench-first dual damascene process, the wafer is wet cleaned in a single step wet clean process using a novel wet clean solvent composition. The wet clean solvent effectively cleans the dry etch residue from the plasma etching of the dual damascene openings, etches back the TiN hard mask layer along the dual damascene openings and forms a recessed surface at the conductor metal from layer below exposed at the bottom of the via openings of the dual damascene openings.

3 Claims, 4 Drawing Sheets

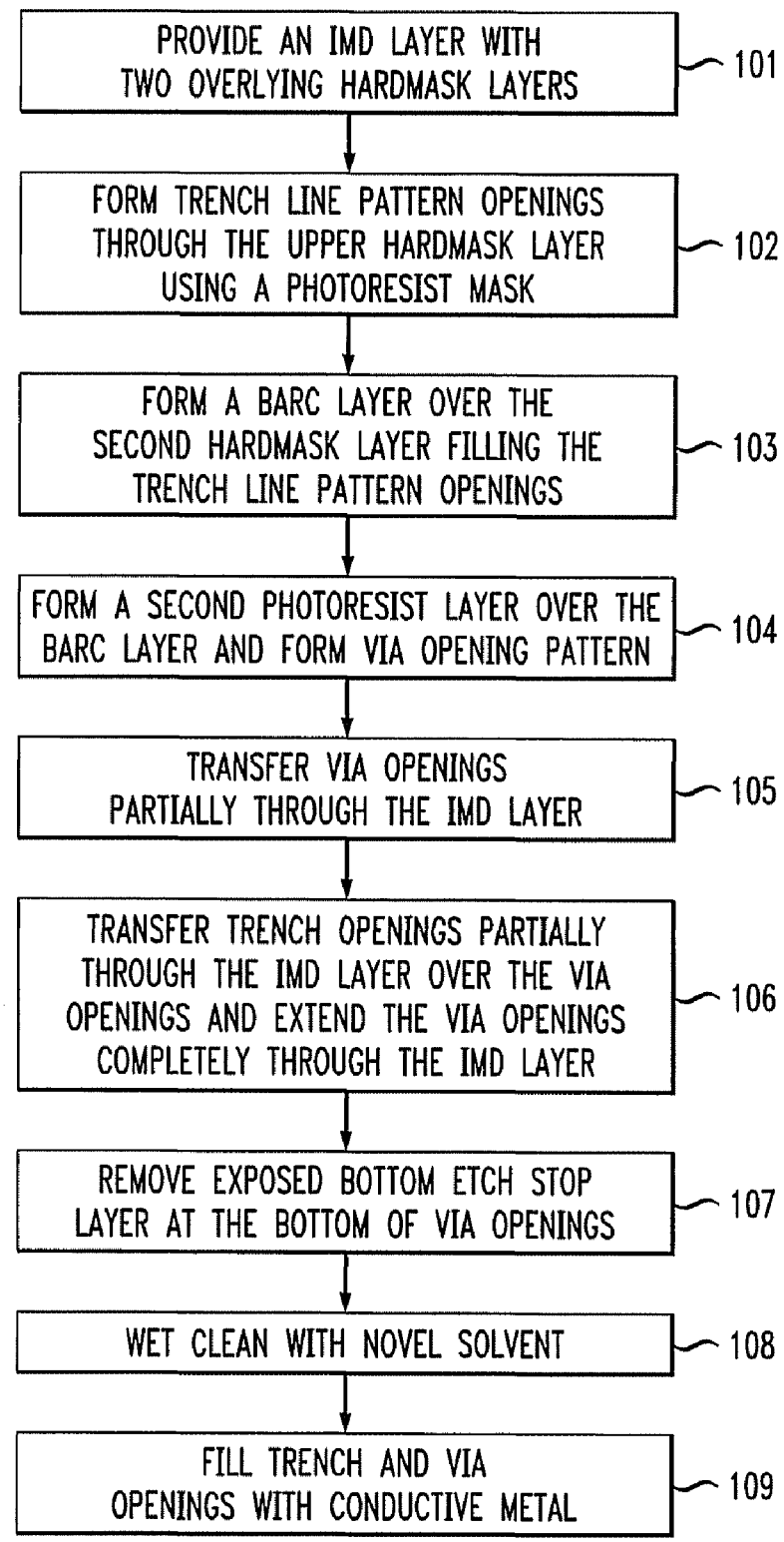

WET CLEANING STRIPPING OF ETCH RESIDUE AFTER TRENCH AND VIA OPENING FORMATION IN DUAL DAMASCENE PROCESS

CROSS-REFERENCE TO RELATED APPLICATIONS

None

BACKGROUND

The present invention relates generally to semiconductor device fabrication and more particularly to wet clean stripping of dry etch residue in trench-first dual damascene process for fabricating semiconductor devices.

In a self-aligned dual damascene or trench-first dual damascene formation process, two hard mask layers provided over the inter-metal dielectric (IMD) layer are used to form the trench and via opening patterns. The trench openings are patterned over the first or the top-most hard mask layer. This is followed by patterning and etching via openings over the second hard mask layer within the patterned trench openings. Next, the trench and via patterns are simultaneously etched into the IMD layer using both hard mask layers etching masks.

The etching of the IMD layer is accomplished by dry plasma etching. During the plasma etching of the IMD layer, the hard mask layer materials often interact with the photoresist and leaves residual polymeric etching contaminants along the sidewalls and bottom of the dual damascene trench via pattern openings. In trench-first dual damascene processes utilizing TiN metal hard mask as one of the two hard mask layers, the dry plasma etching process tend to produce two types of polymer residue contaminants, carbon-rich polymer and Ti-rich polymer contaminants. These polymeric contaminants can interfere with the subsequent metal filling of the dual damascene openings and degrade electrical performance and reliability of the dual damascene structure. In conventional trench-first dual damascene processes, two separate wet clean process steps, one strong alkaline based and one strong acid based are used in an attempt to clean the residues. But having two separate wet clean processes are costly and also has the unwanted side-effect of attacking too much of the copper metal in the metal layer below.

SUMMARY

According to an embodiment of the present disclosure an improved self-aligning or trench-first method for forming a dual damascene is disclosed. The method comprises providing a semiconductor process wafer that comprises an inter-metal dielectric insulation (IMD) layer and two hard mask layers overlying the IMD layer. The two hard mask layers comprise an upper hard mask layer of TiN and a lower hard mask layer of undoped silicate glass (USG). The IMD layer overlies a bottom etch stop layer and a copper conductor metal layer below. Next, trench line pattern openings extending through the upper hard mask layer are formed using a photoresist mask. Then, a bottom anti-reflective coating (BARC) layer is formed over the trench line pattern openings filling the trench line pattern openings and a second photoresist layer is formed over the BARC layer and the upper hard mask layer. The photoresist layer is used to form via opening pattern by a photolithography process. The via opening pattern extends through the photoresist layer and the BARC layer. Next, the via opening pattern is transferred through the lower hard mask layer and partially through the IMD layer by a dry plasma etching thus forming via pattern openings that extend partially through the thickness of the IMD layer. Next, the trench line pattern openings are transferred over the via pattern openings, through the lower hard mask layer and partially through the IMD layer by a dry plasma etching. While the trench line pattern openings are being etched, the via pattern openings are also simultaneously etched by the dry plasma etching and extended completely through the IMD layer until the bottom etch stop layer is exposed at the bottom of the via pattern openings. The exposed bottom etch stop layer at the bottom of the via pattern openings are then removed by further dry etching exposing the copper conductor metal layer below.

The resulting trench line pattern and via pattern openings are wet cleaned using a solvent consisting essentially of at least four of but no more than eight of the propylene glycol monomethyl ether, ethylene glycol, 1,4-butynediol, butyrolactone, diethylene glycol monoethyl ether, diethylene glycol monobutyl ether, diethylene glycol monohexyl ether, tetrahydrothiophene-1,1-dioxide, N,N-dimethylacetamide, N-methyl-2-pyrrolidone, cyclopentanone, dimethylsulfoxide, ethylenediaminetetraacetic acid, Ethylenebis (oxyethylenenitrilo)tetraacetic acid, EGTA, trans-1,2-Diaminocyclohexane-N,N,N',N'-tetraacetic acid hydrate, diethylenetriamine-pentaacetic acid, DTPA, 1,4,7,10-tetraazacyclododecane-tetraacetic acid, triethylenetetramine-N,N,N',N'',N''',N'''-hexaacetic acid, nitrilotriacetic acid, propionic acid, 1,2,3-Benzotriazole, benzene-1,2,4-tricarboxylic acid, 1,2,4-triazole, 7-methylindole-2-carboxylic acid, thioglycerol, 4-Methylmorpholine N-oxide monohydrate, isonicotinic acid N-oxide, 4-Methoxypyridine-N-oxide hydrate, 3-Hydroxypyridine-N-oxide, pyridine-N-oxide, tetramethyl ammonium hydroxide, tetraethylammonium hydroxide, tetra-n-butylammonium hydroxide, ammonium fluoride, tetrabutylammonium fluoride, and 1,3-dimethyl-2-imidazolidinone. The wet cleaning process causes the sidewalls of the upper metal hard mask layer of TiN along the trench line pattern and the via pattern openings to pull back and also removes some of the conductor metal layer at the exposed surface of the copper conductor metal layer at the bottom of the via openings leaving behind a recessed surface. Finally, the trench line pattern and the via pattern openings are filled by depositing a copper conductor metal thus forming the dual damascene structure.

The dual damascene structure formed according to the trench-first dual damascene method above provides a number of improvements over the conventional trench-first dual damascene process. One benefit is that the resulting dual damascene structure exhibit substantially less polymeric etching residue contaminants along the sidewalls and bottom of the dual damascene trench/via pattern openings. Secondly, the pull back of the TiN hard mask layer provides wider openings for better copper metal deposition of the dual damascene structure. Thirdly, the recessed surface of the copper conductor metal layer below formed at the bottom of the via opening increases the contact area between the copper conductor metal layer below and the copper metal filling the via openings, thus improving the electromigration concerns at the copper via/line intersection at the bottom of the dual damascene structures.

BRIEF DESCRIPTION OF THE DRAWINGS

FIG. 2 is a flow diagram of a method according to an embodiment of the present disclosure.

DETAILED DESCRIPTION

Figure 1A:
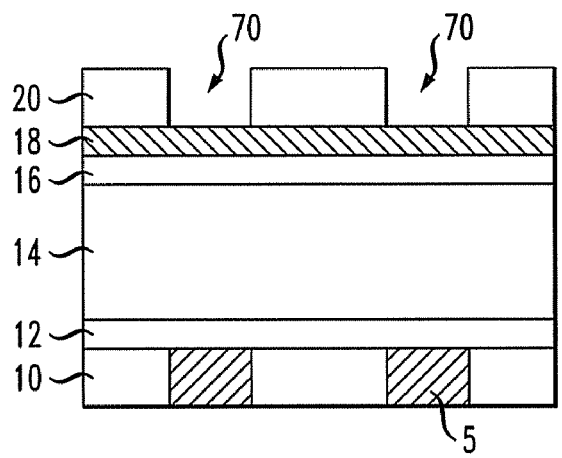
FIGS. 1A-1F are schematic cross-sectional diagrams of a portion of a back end of the line (BEOL) interconnection structure at various stages in a trench-first dual damascene process of the present disclosure.
Figure 1B:
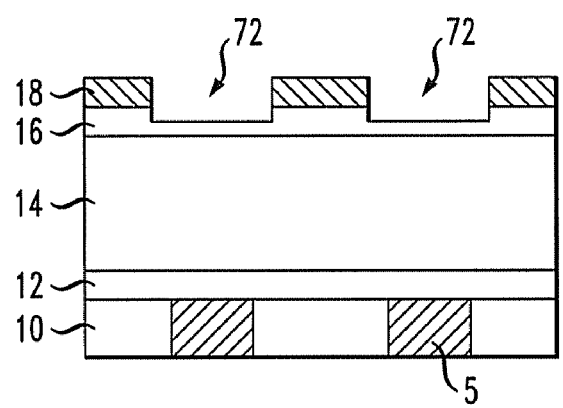

In connection with an exemplary embodiment, FIGS. 1A-1F are shown schematic cross-sectional views of a portion of a back end of the line (BEOL) interconnection structure at various stages in a trench-first dual damascene process disclosed herein. FIG. 1A shows a metallization layer 10 of dielectric material containing conductive metal features 5, having an overlying bottom etch stop layer 12. The conductive metal features 5 in typical dual damascene structures are copper metal or copper alloy for example. The bottom etch stop layer 12 is formed over the metallization layer 10 and can be formed of, for example, silicon nitride (SiN), silicon oxynitride (SiON), silicon carbide (SiC), or silicon oxycarbide (SiOC) or combination thereof. In the illustrated example, the bottom etch stop layer 12 is SiC. The bottom etch stop layer 12 can be formed by chemical vapor deposition (CVD) process, a plasma enhanced CVD (PECVD) or HDP-CVD process at a thickness of about 100 Angstroms to 500 Angstroms depending on the underlying device characteristic dimension design rules.

Formed over the bottom etch stop layer 12 is an inter-metal dielectric insulating (IMD) layer 14. The IMD layer 14 is preferably formed of an ultra low-K (dielectric constant) material, preferably carbon doped silicon oxide, organo-silicate glass (OSG), fluorinated silicon oxide, or combination thereof having a dielectric constant of less than 2.5. In the illustrated example, the IMD layer 14 is SiOC. The low-K IMD layer 14 also can be formed by a CVD, preferably by HDP-CVD or PECVD process to a thickness of about 500 to 3000 Angstroms, depending on the design ground rules.

Formed over the IMD layer 14 is first of two hard mask layers, a dielectric anti-reflective coating (ARC) layer 16, preferably an inorganic material that also functions as an etching hard mask. In the illustrated example, this first hard mask layer is undoped silicate glass (USG). Formed over the first hard mask layer 16 is a second of the two hard mask layers, a metal hard mask layer 18 that also acts as a bottom anti-reflective coating (BARC) layer. In the illustrated example, the metal hard mask layer 18 is TiN.

Still referring to FIG. 1A, the trench-first dual damascene process begins with forming a photoresist layer 20 over the double hard mask layers 16 and 18 and forming trench line pattern 70 using photolithography. Then, referring to FIG. 1B, the trench line pattern 70 is transferred through the thickness of the TiN upper hard mask layer 18 forming trench line pattern openings 72 in the TiN upper hard mask layer 18. The trench line pattern openings 72 are formed by a dry etching process (e.g. plasma etching) using the USG lower hard mask layer 16 as etch stop. The photoresist layer 20 is then stripped by a wet or dry stripping process.

Figure 1C:
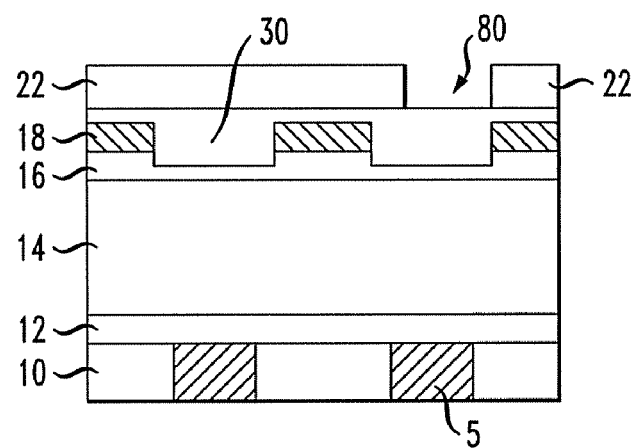

Referring to FIG. 1C, the trench line pattern openings 72 are filled with a spin-on organic BARC layer 30 and covered with a second photoresist layer 22, the second photoresist layer 22 being formed over the BARC layer 30 and the upper hard mask layer 18. Then a via opening pattern 80 is formed in the second photoresist layer 22 by a photolithography process. As shown, in the trench-first dual damascene process the via opening pattern 80 is formed over the trench line pattern openings 72 and the organic BARC layer 30.

Figure 1D:
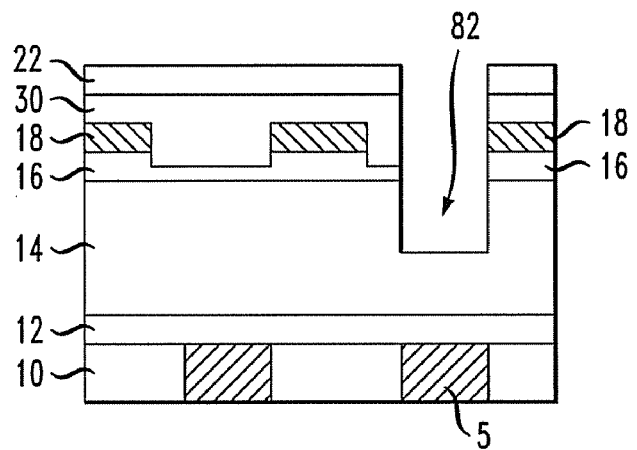

Referring to FIG. 1D, the via opening pattern 80 is transferred by plasma etching through the BARC layer 30, the USG layer 16, and partially through the IMD layer 14 by a timed etching process. For example, the via openings 82 are etched to a depth of about ½ or greater of the IMD layer 14 thickness.

Figure 1E:
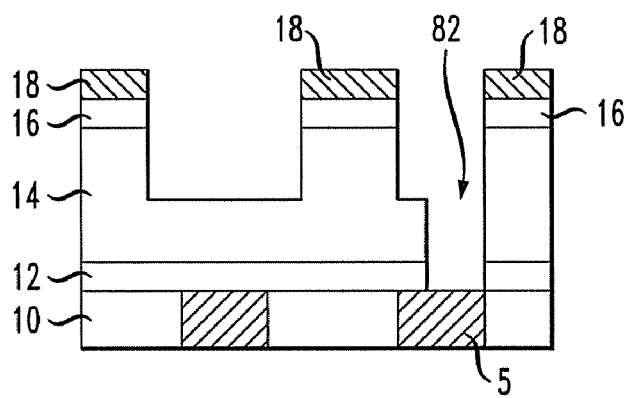

Referring to FIG. 1E, following stripping of the organic BARC layer 30 and the second photoresist layer 22 to expose the trench line pattern openings 72 formed in the TiN upper hard mask layer 18, a plasma etching process is used to transfer the trench line pattern openings 72 partially into the IMD layer 14 using the TiN upper hard mask layer 18 as an etch mask to an appropriate trench depth. Simultaneously, the plasma etching process also etches the via openings 82 further and through the IMD layer 14. The bottom etch stop layer 12 is then removed at the bottom of the via openings 82 exposing the copper conductor metal features 5 below.

Figure 1F:
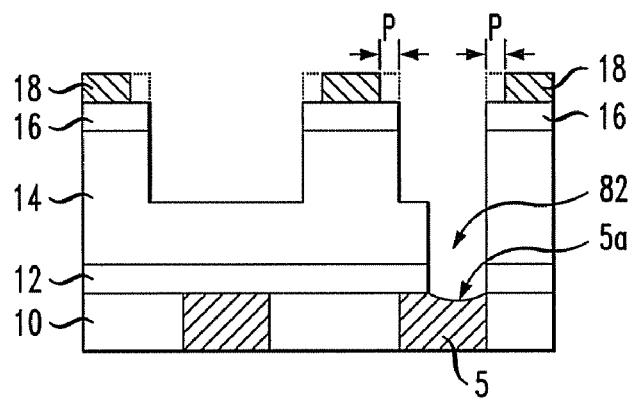

Referring to FIG. 1F, after the dry etching of the trench line pattern openings 72 and the via openings 82, the wafer is wet cleaned in a single step wet clean process using a solvent composition specified below to remove any residual contaminant material from the dry etch process and to etch back the TiN upper hard mask layer 18. The wet cleaning solvent of the present disclosure consists essentially of at least four of but no more than eight of the propylene glycol monomethyl ether, ethylene glycol, 1,4-butynediol, butyrolactone, diethylene glycol monoethyl ether, diethylene glycol monobutyl ether, diethylene glycol monohexyl ether, tetrahydrothiophene-1,1-dioxide, N,N-dimethylacetamide, N-methyl-2-pyrrolidone, cyclopentanone, dimethylsulfoxide, ethylenediaminetetraacetic acid, Ethylenebis(oxyethylenenitrilo)tetraacetic acid, EGTA, trans-1,2-Diaminocyclohexane-N,N,N',N'-tetraacetic acid hydrate, diethylenetriamine-pentaacetic acid, DTPA, 1,4,7,10-tetraazacyclododecane-tetraacetic acid, triethylenetetramine-N,N,N',N'',N''',N''''-hexaacetic acid, nitrilotriacetic acid, propionic acid, 1,2,3-Benzotriazole, benzene-1,2,4-tricarboxylic acid, 1,2,4-triazole, 7-methylindole-2-carboxylic acid, thioglycerol, 4-Methylmolpholine N-oxide monohydrate, isonicotinic acid N-oxide, 4-Methoxypyridine-N-oxide hydrate, 3-Hydroxypyridine-N-oxide, pyridine-N-oxide, tetramethyl ammonium hydroxide, tetraethylammonium hydroxide, tetra-n-butylammonium hydroxide, ammonium fluoride, tetrabutylammonium fluoride, and 1,3-dimethyl-2-imidazolidinone.

The wet clean solvent mixture should contain less than 500 ppb of each of the trace metals such as Al, Ca, Cr, Cu, Fe, Pb, Li, Mg, Mn, Ni, K and Na to sustain stable wafer cleaning process with peroxide. The wet cleaning of the trench and via openings using the above-mentioned solvent is preferably carried out in a wet cleaning tool with the solvent temperature in the range of 40-70 deg. C.

Furthermore, the wet cleaning solvent comprises 0.01-30 wt. % peroxide, has a pH value of 7-10, has a de-ionized water content of less than 30 wt % and a viscosity of 5-25 c.p. The wet cleaning solvent has the following metal etch rates: TiN 0.5-50 Å/min, Cu 0.5-50 Å/min, Co 0.5-50 Å/min and Copper silicide ($Cu_5Si$) 0.5-50 Å/min. The term "consisting essentially of" is used herein to mean that additional substances may be added to the solvent composition provided they do not substantially alter the nature of the solvent composition. Substances that cause the metal etch rates of the wet cleaning solvent to be outside the ranges defined above are substances that substantially alter the nature of the solvent composition.

Figure 1G:
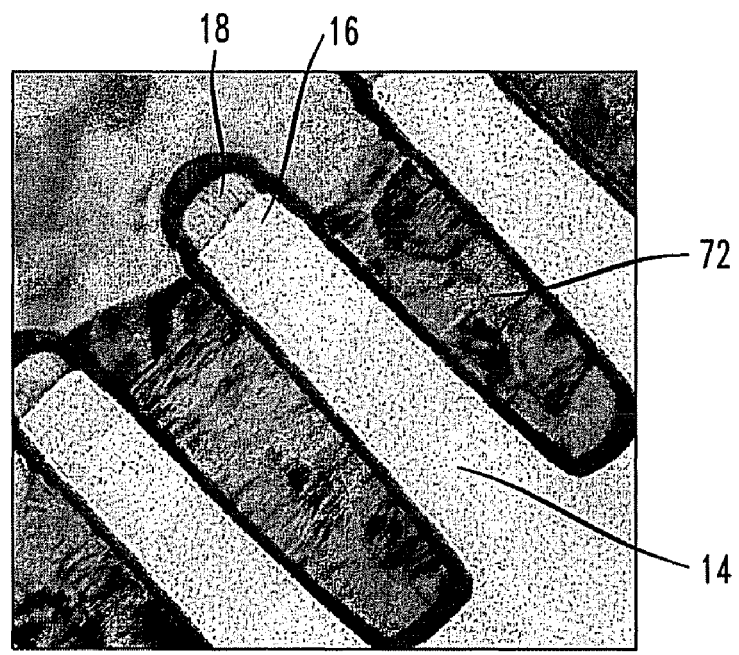
FIG. 1G is a micrograph of a cross-sectional view of trench lines in a dual damascene structure formed according to the process of the present disclosure showing the details of the TiN metal hard mask pull back.
Figure 1H:
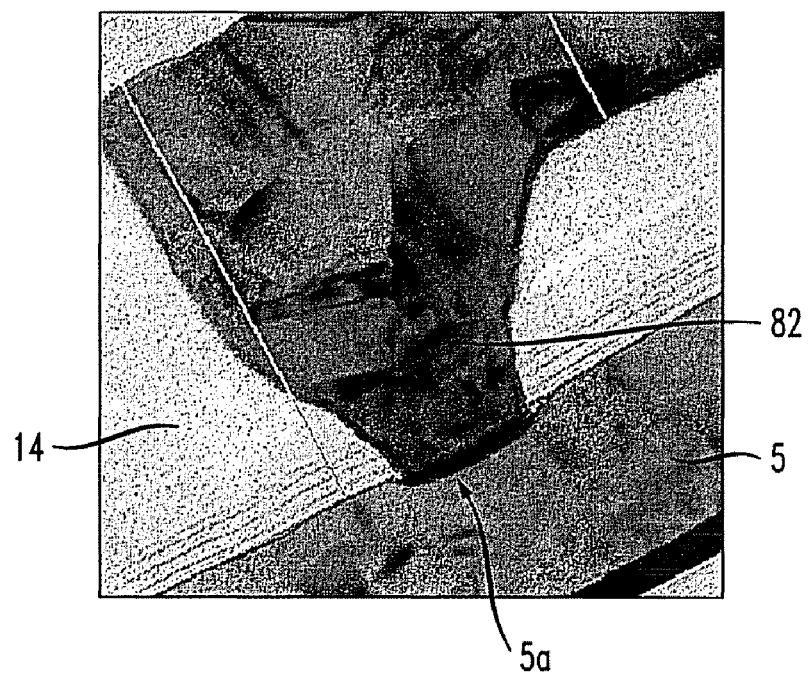
FIG. 1H is a micrograph of a cross-sectional view showing the details of the interface between a dual damascene copper via and a copper conductor feature in the layer below in a dual damascene structure formed according to the process of the present disclosure.

The wet clean solvent effectively removes both the carbon-rich polymer residues and the Ti-rich polymer residues that often remain along the sidewalls of the via and trench openings. Some examples of the etch residue are: TiN residue, CxFy residue, CuOx residue, CuFx residue, etc. Additionally, as shown in FIG. 1F and the micrograph of FIG. 1G, the wet clean using the novel solvent also controllably etches back the TiN metal hard mask layer 18 and makes the TiN metal hardmaks layer 18 to reduce in size or effectively "pull back" from the sidewalls of the trench and via openings 72, 82. This provides a wider entrance to the trench and via openings 72, 82 for the subsequent copper metal deposition to complete the dual damascene structure. Furthermore, as shown in FIG. 1F and the micrograph of FIG. 1H, the wet clean process of the present disclosure also controllably etches the surface of the exposed underlying copper conductor feature 5 at the bottom of the via opening 82 resulting in a recessed copper conductor surface 5a. When the via opening 82 is subsequently filled with copper metal, the via-to-underlying conductor contact interface formed at the recessed surface 5a appears to provide better electrical connection by providing increased contact area between the via metal and the underlying metal. The increased contact area effectively lowers the current density at the via-to-underlying conductor contact interface and lowers electromigration concerns at that interface.

FIG. 2 is a flow chart diagram 100 of the exemplary process described herein. First, a semiconductor process wafer comprising an IMD layer 14 with two hard mask layers 16, 18 overlying the IMD layer 14 is provided (see box 101). Next, trench line pattern openings 72 extending through the upper hard mask layer 18 are formed using a photoresist mask 20 (see box 102). Next, a BARC layer 30 formed over the lower hard mask layer 16 filling the trench line pattern openings 72 (see box 103). Next, a second photoresist layer 22 is formed over the BARC layer 30 and the upper hard mask layer 18 and a via opening pattern 80 is formed in the second photoresist layer 22 and the BARC layer 30 (see box 104). Next, the via opening pattern 80 is transferred through the lower hard mask layer 16 and partially through the IMD layer 14 thus forming via openings 82 (see box 105). Next, the trench line pattern openings are transferred partially through the IMD layer 14 over the via openings 82 and the via openings 82 are simultaneously extended completely through the IMD layer 14 by dry plasma etching (see box 106), whereby exposing the bottom etch stop layer. Next, the exposed bottom etch stop layer 12 in the via openings 82 is etched away exposing the underlying conductor metal feature 5 (see box 107). At this point, the semiconductor process wafer is wet cleaned using the novel solvent composition of the present disclosure (see box 108). The trench and via openings 72, 82 are subsequently filled with conductive metal such as copper to complete the dual damascene structure (see box 109).

While the invention has been particularly shown and described with reference to the preferred embodiments thereof, it will be understood by those skilled in the art that various changes in form and details may be made without departing from the spirit and scope of the invention. Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A wet cleaning solvent for cleaning the trench and via openings in a dual damascene structure after the trench and via openings are dry etched, said cleaning solvent consisting essentially of:

at least four of but no more than eight of the propylene glycol monomethyl ether, ethylene glycol, 1,4-butynediol, butyrolactone, diethylene glycol monoethyl ether, diethylene glycol monobutyl ether, diethylene glycol monohexyl ether, tetrahydrothiophene-1,1-dioxide, N,N-dimethylacetamide, N-methyl-2-pyrrolidone, cyclopentanone, dimethylsulfoxide, ethylenediaminetetraacetic acid, Ethylenebis(oxyethylenenitrilo)tetraacetic acid, EGTA, trans-1,2-Diaminocyclohexane-N,N,N',N'-tetraacetic acid hydrate, diethylenetriaminepentaacetic acid, DTPA, 1,4,7,10-tetraazacyclododecane-tetraacetic acid, triethylenetetramine-N,N,N',N'',N''',N'''-hexaacetic acid, nitrilotriacetic acid, propionic acid, 1,2,3-Benzotriazole, benzene-1,2,4-tricarboxylic acid, 1,2,4-triazole, 7-methylindole-2-carboxylic acid, thioglycerol, 4-Methylmorpholine N-oxide monohydrate, isonicotinic acid N-oxide, 4-Methoxypyridine-N-oxide hydrate, 3-Hydroxypyridine-N-oxide, pyridine-N-oxide, tetramethyl ammonium hydroxide, tetraethylammonium hydroxide, tetra-n-butylammonium hydroxide, ammonium fluoride, tetrabutylammonium fluoride, and 1,3-dimethyl-2-imidazolidinone, wherein the wet cleaning solvent comprises less than 500 ppb of each of the following trace elements: Al, Ca, Cr, Cu, Fe, Pb, Li, Mg, Mn, Ni, K, and Na.

2. The wet cleaning solvent of claim 1, wherein the wet cleaning solvent comprises:

0.01-30 wt. % peroxide;
a pH value of 7-10;
de-ionized water content of less than 15 wt %; and
a viscosity of 5-25 c.p.

3. The wet cleaning solvent of claim 1, wherein the wet cleaning solvent has the following metal etch rate: TiN 0.5-50 Å/min, Cu 0.5-50 Å/min, Co 0.5-50 Å/min, Copper silicide ($Cu_5Si$) 0.5-50 Å/min.

* * * * *

UNITED STATES PATENT AND TRADEMARK OFFICE
CERTIFICATE OF CORRECTION

PATENT NO.      : 7,968,506 B2                   Page 1 of 1
APPLICATION NO. : 12/203448
DATED           : June 28, 2011
INVENTOR(S)     : Chun-Li Chou et al.

It is certified that error appears in the above-identified patent and that said Letters Patent is hereby corrected as shown below:

Column 4, Line 45, delete "Methylmolpholine" and replace with -- Methylmorpholine -- therefor.

Signed and Sealed this
Twenty-fourth Day of January, 2012

David J. Kappos
*Director of the United States Patent and Trademark Office*